United States Patent
Gao et al.

[11] Patent Number: 5,928,750
[45] Date of Patent: Jul. 27, 1999

[54] SPUTTERED THERMALLY CYCLED TEXTURE LAYERS FORMED OF HIGH MELTING POINT MATERIALS

[75] Inventors: Chuan Gao; Darrin Massey, both of Fremont, Calif.

[73] Assignee: Seagate Technology, Inc., Scotts Valley, Calif.

[21] Appl. No.: 08/860,257

[22] PCT Filed: Nov. 3, 1995

[86] PCT No.: PCT/US95/14225

§ 371 Date: Jun. 26, 1997

§ 102(e) Date: Jun. 26, 1997

[87] PCT Pub. No.: WO97/16826

PCT Pub. Date: May 9, 1997

[51] Int. Cl.[6] .................................................... B32B 3/02
[52] U.S. Cl. ...................... 428/64.1; 428/64.2; 428/65.3; 428/694 R; 204/192.1
[58] Field of Search .................................. 428/64.1, 64.2, 428/65.3, 65.6, 65.7, 66.6, 650, 688, 694 R, 694 T, 694 TS; 204/192.1

[56] References Cited

U.S. PATENT DOCUMENTS

| | | | |
|---|---|---|---|
| 4,747,928 | 5/1988 | Takahashi et al. | 204/298 |
| 5,427,867 | 6/1995 | Kogure et al. | 428/611 |
| 5,681,635 | 10/1997 | Nelson et al. | 428/65.3 |
| 5,721,033 | 2/1998 | Teng et al. | 428/65.3 |

FOREIGN PATENT DOCUMENTS

| | | |
|---|---|---|
| 0574835 | 12/1993 | European Pat. Off. . |
| 0651380 | 5/1995 | European Pat. Off. . |

*Primary Examiner*—Elizabeth Evans
*Attorney, Agent, or Firm*—Frederick W. Niebuhr

[57] ABSTRACT

A process for fabricating a magnetic data storage medium includes formation of a controlled texture, either over an annular transducing head contact area or the entire surface of a substrate. The texture layer is formed by vacuum deposition of a texturing material onto a smooth surface of a non-magnetic substrate. The texturing material has a surface energy greater than that of the substrate, and the texturing material and substrate material have different linear coefficients of thermal expansion. Just before deposition of the texture layer, the substrate is heated to a temperature of 200–600° C., then allowed to cool during texture layer deposition. The substrate and texture layer contract at different rates as they cool, inducing mechanical stresses within the texture layer sufficient to plastically deform the texture layer, creating multiple dome-like bumps. Subsequent thin film layers, including an underlayer, a magnetic recording layer and a protective cover layer, have uniform thicknesses and tend to replicate the texture layer topography. The resulting medium performs well under CSS testing at flying heights of less than 1.0 microinch, and exhibits excellent corrosive resistance when the substrate is formed of glass, glass ceramic or quartz. The process can be performed on all conventional types of substrates, including aluminum nickel-phosphorous substrates.

34 Claims, 8 Drawing Sheets

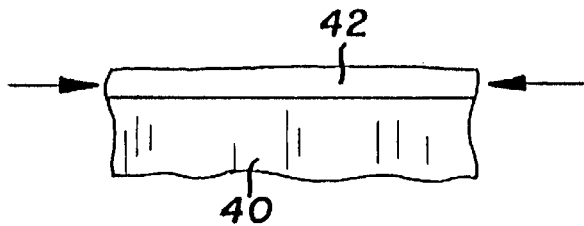
FIG.4          FIG.5
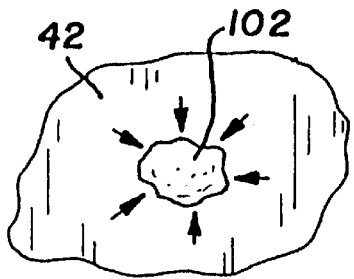          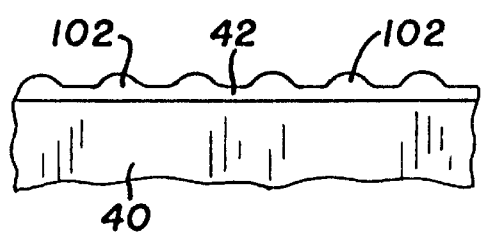
FIG.6          FIG.7
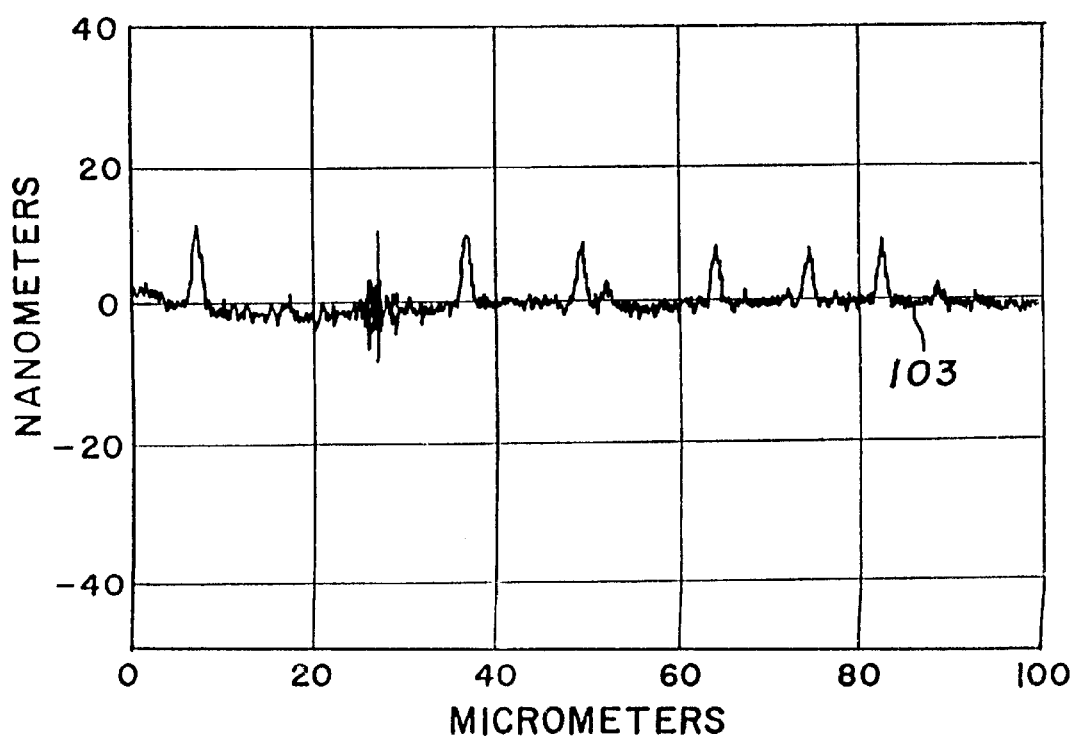
FIG.8

SPUTTERED THERMALLY CYCLED TEXTURE LAYERS FORMED OF HIGH MELTING POINT MATERIALS

BACKGROUND OF THE INVENTION

The present invention relates to media for recording, storing and reading magnetic data, and more particularly to means for controlling the surface topographies of magnetic media.

Magnetic disks employ thin films of magnetizable material for storing data in magnetic form. Typically, the magnetic disks are rotatably mounted, with one or more magnetic data transducing heads positioned in close proximity to the recording surfaces of the disks. Each transducing head is movable generally radially relative to its associated disk as the disk is rotated. Rigid magnetic disks are rotated at high speeds during reading and recording operations, to create an air cushion or bearing that supports each transducing head at a controlled distance from its associated recording surface, thus to maintain a consist head glide height or flying height. Also, there are times when the transducing heads contact their associated disks; in particular when the disks are stationary, during disk acceleration from a stop, and during deceleration toward a complete stop.

To increase magnetic data storage density it is desirable to minimize the transducing head flying height. To achieve low flying heights, the recording surface must be flat and smooth, but not so smooth as to cause head media interface stiction. As a result, recording surfaces of magnetic media are intentionally provided with a texture, selected to provide low glide height yet minimize friction and wear.

Traditionally, mechanical abrasion has been used for this purpose. Typically, a cloth, paper or pad coated or saturated with a suitable grit is used. Abrasion removes substantial amounts of substrate material and takes considerable time, adding substantially to media production costs. The abrasion process is low precision, and vulnerable to defect generation.

While mechanical texturing is predominant in commercially available media, chemical etching and printing techniques have been employed to provide texture. More recently, laser energy has been disclosed for media texturing, e.g. as in U.S. Pat. No. 5,108,781 (Ranjan et al.). A pulsed laser beam is focused upon the upper surface of an aluminum nickel-phosphorous substrate to form laser marks, each with a central depression surrounded by a raised rim. As disclosed in application Ser. No. PCTUS95/10697 entitled "PULSED LASER SURFACE TREATMENTS FOR MAGNETIC RECORDING MEDIA", filed Aug. 22, 1995, and assigned to the assignee of this application, laser energy can be used to create outwardly projecting nodules, and to polish a substrate surface. The technique is applied to aluminum Ni—P substrates, and to metallic layers formed on glass substrates.

The continuing trend toward higher data recording densities has lead to the use of alternatives to the traditional aluminum Ni—P substrate, e.g. glass, glass ceramics, and quartz ($SiO_2$). Although these substrates can be mechanically abrated, the problems discussed above in connection with aluminum Ni—P substrates, particularly low precision and defect generation, are more serious in the case of the non-metallic substrates.

Low melting point materials have been sputtered onto non-wetting substrates to provide texture. For example, gallium has been sputtered onto glass substrates while being maintained above its melting point of 29.8° C. Due to surface tension, the deposited Ga forms spherical liquid features. Subsequent deposition of a magnetic film form alloys and intermetallics that solidify the gallium layer and replicate its topography. An alloy of indium and tin has been applied in a similar manner. Such low melting point materials, however, cannot be applied in a manner that provides separation between adjacent bumps. Further, substrates must be mechanically textured before these materials are sputtered, or the substrate material must have some kind of intrinsic "built-in" texture (such as glass-ceramic substrates discussed immediately below). In connection with glass substrates, several alternative texturing techniques have been attempted, including spin coating, etching, sputtering, and annealing. These have been less than satisfactory in general.

In connection with glass ceramic substrates, mechanical abrasion can cause a "built in" texture in the substrate by removing previously embedded hard particulates. This built in texture is comprised of multiple pits surrounded by "volcanic" rims. Substrates textured in this manner have performed well in CSS testing. However, because of the porosity of metal films deposited onto these substrates, mobile alkali ions (e.g. $K^+$, $Na^+$, and $Ca^+$ ions), particularly adjacent the pits, have been found to migrate from the glass ceramic substrate into the film and ultimately to the exposed surface of the metal films. This problem, known as "hazing" can be diminished by forming the metal film at a highly increased density and by eliminating the pits. However, achieving the built in texture under these circumstances has been difficult, and CSS and stiction performance has not been satisfactory.

Therefore, it is an object of the present invention to provide a more repeatable and reliable method of texturing substrates for magnetic disks utilizing a variety of non-magnetic substrates.

It also is an object to provide a media fabrication process applicable to all types of substrates, that is much simpler and much less costly than conventional texturing and other substrate texturing techniques currently under development.

Another object is to provide a magnetic disk texturing process that is clean room compatible and minimizes the need to handle substrates, to reduce the chances for defects and contamination.

A further object is to provide a magnetic disk having a more uniform texture and fewer defects.

Another object is to provide a substrate texturing process that affords control over the spacing between adjacent bumps or other features, leading to improved CSS performance.

Yet another object is to provide a magnetic disk having a texture that allows lower transducing head flying heights (i.e. one microinch or less), yet enhances CSS performance.

SUMMARY OF THE INVENTION

To achieve these and other objects, there is provided a process for forming a texture on a non-magnetic substrate, including the following steps:

(a) providing a non-magnetic substrate having a substrate surface and a first linear coefficient of thermal expansion;

(b) selecting a texturing material having a second linear coefficient of thermal expansion different than the first linear coefficient of thermal expansion, and having a surface energy higher than a surface energy of the substrate;

(c) initiating a deposition of the substrate surface when the substrate is at a selected initial temperature, and continuing the deposition to form a thin film texture layer integral with the substrate; and (d) causing a change in the temperature of the substrate away from the selected initial temperature to induce a mechanical stress in said thin film texture layer due to the respective and different changes in dimension of the substrate and thin film texture layer responsive to the temperature change, said induced mechanical stresses exceeding an elastic limit of the texturing material.

Preferably, the temperature change and the deposition of the texturing material occur simultaneously. This approach advantageously employs a heat source to elevate the substrate temperature to a value equal to or greater than the initial temperature, just prior to deposition. The initial temperature can be in the range of about 200 to 600° C., depending on the substrate material and desired bump density, height and diameter. The temperature more preferably is in the range of 200 to 400° C. Upon initiation of deposition, the heat source is removed, allowing the substrate to cool as deposition proceeds.

The texturing material can be deposited by sputtering within a vacuum chamber at a deposition pressure in the range of about 3–50 millitorr. The thin film can be sputtered to a thickness of up to about 5000 Å, and more preferably in the range of 500–3000 Å.

As deposition proceeds, both the substrate and the thin film contract due to their cooling. Having different thermal expansion coefficients, they contract at different rates, which introduces mechanical stresses in the thin film.

The first linear thermal expansion coefficient is greater than the second, so that cooling leads to compressive mechanical stresses in the thin film. Multiple discontinuities are formed throughout the thin film once the mechanical stresses exceed the elastic limit of the texturing material.

A surprising and advantageous result is that the multiple local discontinuities consist substantially of smoothly rounded, dome-like bumps. The bumps are relatively uniform in height, and are distributed substantially uniformly throughout the thin film. The preferred materials for the texturing layer are metals, e.g. titanium, tungsten, chromium, aluminum, gold, silver, and tantalum, or binary alloys of these metals. Titanium and tungsten are particularly preferred, due to their high density.

The bumps tend to have diameters in the range of 1–3 microns, and heights up to 100 nm, more preferably in the range of 7–20 nm. The size of the bumps varies with the selection of the texturing material, but can be controlled by adjusting the substrate temperature when sputtering is initiated and the sputtering pressure, and by controlling the film thickness and the cooling rate. Thicker films, higher initial substrate temperatures, lower sputtering pressures and longer cooling times produce larger bumps. Thus, the process is repeatable to yield thin film texturing layers with a desired average roughness and average bump height, and with a high degree of uniformity.

Another advantage of the texturing process is its compatibility with the usual post-texturing steps in media fabrication. With the non-magnetic substrate in a deposition chamber, the application and texturing of the thin film texture material can be followed by deposition of an underlayer, a thin film of a magnetic recording material, and a protective cover layer, all in a continuous process. There is no need for a mechanical abrasion step or any other texturing step requiring treatment of the substrate outside of the deposition chamber. This substantially reduces the cost of media fabrication by eliminating a treatment step, and also reduces the chance for contamination during fabrication.

After deposition of the texturing material, the substrate and thin film can be reheated to a temperature of at least about 150° C., and then allowed to cool. The reheating step tends to smooth out the bumps, to improve wear characteristics of the textured surface.

The process has been used to form texturing thin films on a variety of substrates, including aluminum Ni—P, glass, glass ceramic, and quartz substrates. The disks exhibit good CSS performance at glide heights of less than about 1 microinch (25 nm). Disks including glass, glass ceramic and quartz substrates show high resistance to haze corrosion when tested at 100% relative humidity. Thus in accordance with the present invention, media reliability and wear characteristics are enhanced by a process utilizing differences in coefficients of thermal expansion and in surface energies, to produce repeatable and reliable texturing in connection with a variety of non-magnetic substrates.

IN THE DRAWINGS

For a further understanding of the above and other features and advantages, reference is made to the following detailed description and to the drawings, in which:

FIGS. 4–7 illustrate the substrate during fabrication of the recording medium;

FIG. 8 and 9 depict Tencor measurement surface profiles of recording media textured according to the present invention;

DETAILED DESCRIPTION OF THE PREFERRED EMBODIMENTS

Figure 1:
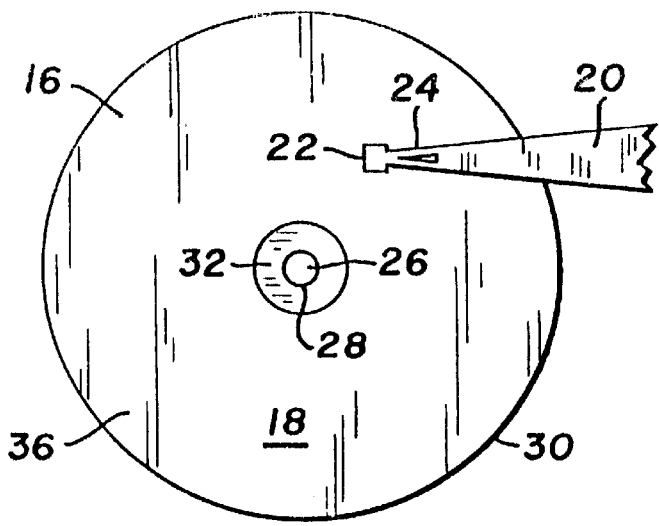
FIG. 1 is a plan view of a rigid magnetic disk formed according to the present invention, and a transducing head supported for generally radial movement relative to the disk.
Figure 2:
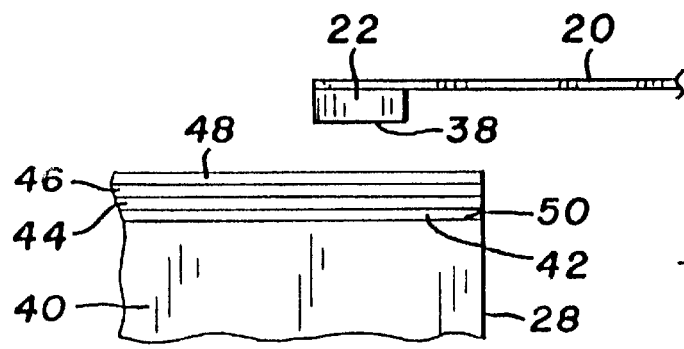
FIG. 2 is an enlarged partial sectional view of the magnetic disk in FIG. 1.

Turning now to the drawings, there is shown in FIGS. 1 and 2 the medium for recording and reading magnetic data, in particular a magnetic disk 16 rotated about a vertical axis and having a substantially planar and horizontal upper surface 18. A rotary actuator (not shown) includes a transducing head support arm 20 supported in cantilevered fashion above the magnetic disk. A magnetic data transducing head 22 is mounted to the free end of the support arm, through a suspension 24 which allows gimballing action of the head. The rotary actuator and the support arm pivot to move head 22 in an arcuate path, generally radially with respect to disk 16.

At the center of the disk is an opening 26 to accommodate a disk drive spindle (not shown) used to rotate the disk. An inner rim 28 defines the opening. Between the opening and an outer rim 30 of the disk, upper surface 18 includes an annular radially inward region 32 where disk 16 is clamped to the spindle, and an annular data zone 36 providing the area for recording and reading the magnetic data.

When disk 16 is at rest, or rotating at a speed substantially below its normal operating range, transducing head 22 contacts upper surface 18. When the disk rotates within its normal operating range, an air bearing or cushion is formed by air flowing between the head and the upper surface in the direction of disk rotation. The air bearing supports the head in parallel, spaced apart relation to the recording surface. Typically the "glide height", i.e. the distance between a planar bottom surface 38 of head 22 and upper surface 18, is about 1 to 2 microinches (25 to 51 nm). A low glide height is preferred, since reducing the glide height increases the density at which data can be stored. For recording and reading, disk rotation and rotary arm pivoting are controlled in concert to selectively position transducing head 22 near desired locations within data zone 36.

As seen from FIG. 2, disk 16 is formed of a substrate disk 40 and multiple thin film layers applied to the substrate including a texture layer 42 applied to the substrate an underlayer 44, a magnetic recording layer 46, and a protective cover layer 48.

Substrate 40 preferably is a disk formed of a glass, a glass ceramic, or quartz ($SiO_2$), and also can be an aluminum substrate plated with a nickel-phosphorous alloy. The initial fabrication step involves polishing, grinding or otherwise machining the substrate disk to provide a substantially flat and smooth upper substrate surface 50. For further processing, the substrate disk is placed within a vacuum deposition apparatus.

Figure 3:
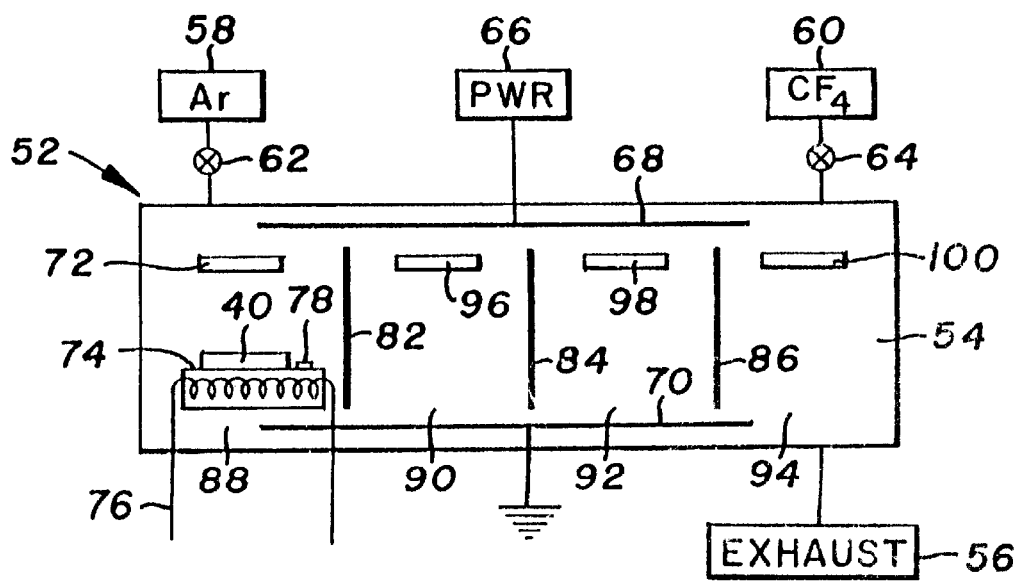
FIG. 3 is a schematic view of a vacuum deposition apparatus utilized in fabricating the magnetic disk, with a non-magnetic substrate enclosed within the chamber.

An example of an apparatus suitable for vacuum deposition is schematically illustrated at 52 in FIG. 3. The apparatus includes a fluid tight plasma chamber 54. An exhaust pump 56 is in fluid communication with chamber 54 for evacuating the chamber when desired. Also in fluid communication with the chamber are a container 58 for supplying argon or another inert gas, and a container 60 for supplying a reactive gas such as hydrogen. Valves 62 and 64 control the supply of their respective gases to the plasma chamber.

A power supply 66 biases a cathode electrode 68 while another electrode 70 is maintained at ground, to generate an electrical field to ionize argon and other gases within plasma chamber 54. A target 72 formed of titanium or another appropriate metal texturing material is positioned near electrode 68. Substrate 40 is supported on a platform 74 near grounded electrode 70. A heating element 76, running through the platform, is operable to heat the platform and thus to heat the substrate. A temperature sensor 78, mounted on platform 74 near substrate 40, provides an indication of the substrate temperature.

Several partitions 82, 84 and 86 divide plasma chamber 54 into subchambers or stations 88, 90, 92, and 94 for respectively applying the texture layer, underlayer, magnetic recording layer and protective layer. For applying the underlayer, subchamber 90 contains a target 96 formed of a suitable underlayer material such as chromium. Subchamber 92 contains a target 98 formed of a magnetic thin film recording material, e.g. CoNiCr or CoCrTa, and subchamber 94 contains a target 100 formed of carbon. Partitions 82, 84 and 86 isolate the stations from one another sufficiently to enable each deposition to proceed under conditions favorable to the particular material involved. While just one power supply 66 is shown, the individual stations can have separate power supplies and cathode electrodes to enhance fabrication process control.

With substrate 40 on platform 74 as shown in FIG. 3, exhaust pump 66 is actuated to substantially evacuate plasma chamber 54. Following evacuation, valve 62 is opened to supply argon to the chamber, until pressure within the chamber reaches a predetermined value, e.g. 10 millitorr. Heating element 76 is actuated to heat substrate 40 to a predetermined initial sputtering temperature in the range of 200–600°C., and more preferably in the range of 200–400° C. The substrate is heated to at least the selected initial temperature before sputtering begins.

With the substrate sufficiently heated and argon at the intended pressure, power is provided to electrode 68 is provided at a desired level, e.g. 40 watts per square centimeter, to generate an electrical field and ionize the argon, thus forming an argon plasma within the chamber. The electrical field accelerates the argon ions onto texturing target 72, sputter depositing titanium onto the exposed annular portion of substrate surface 50. Vacuum deposition continues until texture layer 42 has reached a predetermined thickness in the range of about 500–5,000 angstroms and more preferably 500–3,000 angstroms.

Heating element 76 is inactive during deposition. Consequently, substrate 40 undergoes cooling as texture layer 42 is deposited and continues to cool following deposition. Substrate 40 and texture layer 42 contract as they cool, but at different rates. More particularly, substrate 40 being formed of glass has a linear thermal expansion coefficient in the range of $10-12 \times 10^{-6}$/degree C. Titanium texture layer 42 has a thermal expansion coefficient in the range of $7-8 \times 10^{-6}$/degree C. Accordingly, although the substrate and texture layer experience the same temperature change as they cool, substrate 40 experiences greater contraction.

Because of the adhesion of a texture layer and substrate along their interface, the difference in their contraction causes both to experience mechanical stress. The stresses, i.e. tension in the substrate and compression in the texture layer, initially counteract one another. However, because texture layer 42 is extremely thin compared to the substrate, the effects of the counterbalancing forces are concentrated in the texture layer. The compressive stresses, which act in all directions, are represented by arrows in FIG. 4.

As the substrate and texture layer continue to cool and contract, the compressive forces increase to the point of exceeding the elastic limit of the texturing material. This may occur either during or just after deposition. Throughout texture layer 42, plastic deformation relieves the compressive stress, simultaneously relieving the tensile stress in the substrate. Deformation occurs throughout the texture layer and is highly localized, resulting in multiple dome-shaped bumps 102 uniformly distributed throughout the texture layer, as indicated in FIGS. 5–7. Arrows in FIGS. 5 and 6 indicate stress directions, although stress has been relieved by bump formation. The bumps measure in the range of 1–3 microns in diameter, with a separation of about 3–5 microns between adjacent bumps. Density of the bumps ranges from about $3 \times 10^5$ to about $12 \times 10^5$ bumps/square centimeter. Bumps 102 provide in texture layer 42 an average roughness Ra of about 2 nm and maximum peak heights Rp in the range of from 7–18 nm.

Figure 9:
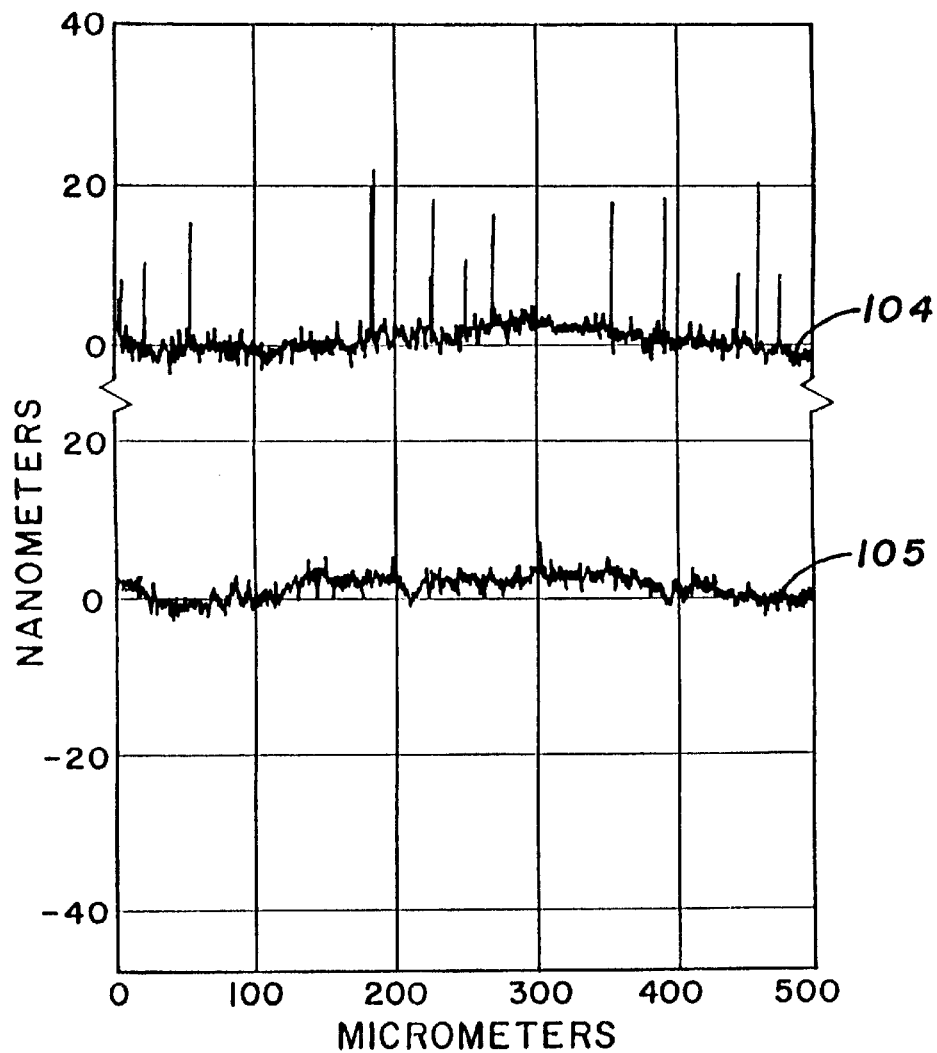

FIGS. 8 and 9 show Tencor measurements of disks having texture layers formed in the same manner as texture layer 42.

The texture layer represented in FIG. 8 was formed on an aluminum substrate. The profile, indicated at 103, reveals uniformity in peak heights, all of which are well below 20 nm. The disk represented in FIG. 9 included a Pilkington smooth glass substrate. A profile 104 shows that most peak heights are below 20 nm, although peaks can equal or exceed that value. A profile 105, of the substrate before application of the texture layer, is shown for comparison with profile 104.

As an option, substrate 40 and texture layer 42 can be subjected to a further thermal cycle, in particular by operating heating element 76 to heat the substrate to a temperature of about 150° C., or in any event substantially less than the selected initial temperature for texture layer deposition. The additional thermal cycling tends to smooth out bumps 102, thus to enhance the wear characteristics of the contact zone.

After application and deformation of texture layer 42, substrate 40 is transferred to station 90 for deposition of chromium underlayer 44. Deposition in an argon atmosphere proceeds at a pressure of about 5–20 millitorr and at a temperature of about 200° C., to apply underlayer 44 to a thickness of about 2,000 angstroms.

Next, substrate 40 is transferred to station 92 for application of thin film magnetic recording layer 46. Deposition proceeds at a pressure of about 10 millitorr and at a temperature of about 150° C. Recording layer 46 is deposited to a thickness of about 200–400 angstroms. The crystalline structure of the magnetic recording layer tends to replicate the underlayer crystalline structure. Deposition occurs in an argon atmosphere.

Finally, the substrate is transferred to station 94 for application of protective carbon layer 48, preferably in an argon atmosphere at a pressure of 10 millitorr and at a deposition temperature of 150° C. If hydrogenation of the carbon layer is desired, particularly near the upper surface, valve 74 is opened to introduce hydrogen.

Underlayer 44, magnetic recording layer 46 and protective layer 48 are deposited at respective uniform thicknesses. Accordingly, each layer tends to replicate the surface topography of the layer beneath it, with a slight tendency to round the bumps. Nonetheless, tencor profile measurements are substantially identical, whether taken immediately after deposition of the texture layer, or after the remaining layers have been added. The disk surface thus retains the dome-like bumps that provide the average roughness and peak height indicated above.

The formation of a texture by thermal cycling affords several advantages over previous texturing approaches, including simpler and much less expensive fabrication, reduced processing time, more repeatable results and results subject to control by varying several key process parameters. Fabrication cost and complexity are substantially reduced by elimination of a separate texturizing step (whether mechanical abrasion, etching or laser ablation) that would require treatment of the medium outside of the plasma chamber. As to processing speed, the size of textured areas can be increased without substantially increasing processing time, since the entire substrate and texture layer contract as they cool, regardless of their size. The resulting texture layer profiles exhibit a high degree of uniformity and consistency when applied under the same sputtering conditions, particularly sputtering pressure and temperature but also power level.

Sputtering conditions can be controlled to vary the nature of the bumps formed by texture layer deformation. In particular, increasing the thickness of the texture layer increases the size of the dome-shaped bumps. Bump size likewise can be increased by increasing the substrate temperature at the beginning of texture layer deposition. Longer cooling times lead to larger bumps. By contrast, increasing the argon pressure tends to reduce bump size. The density can be increased, i.e. the separation between adjacent bumps can be reduced, by preheating the substrate to a higher temperature just before sputtering. Finally, the topography depends on the texture layer material. Titanium and tungsten are highly preferred texturing materials, and the following alternative materials may be employed: chromium, aluminum, copper, lead, tin, gold, silver, and tantalum. Of course, the substrate material also influences topography since the build up of stresses depends upon the differences in the thermal expansion coefficients of the substrate and texture layer. Material surface energy also has been found to be a key consideration. In particular, for bump formation it is important that a surface energy of the texture material be higher than the surface energy of the substrate.

The following examples illustrate how results are influenced by the selection of materials and setting of parameters.

EXAMPLE 1

A titanium texture layer (thermal expansion coefficient of $8 \times 10^{-6}$/degree C.) was sputter deposited onto a super smooth glass-ceramic substrate having a thermal expansion coefficient of $12 \times 10^{-6}$/degree C. The respective surface energies of the Ti texture material and the glass-ceramic substrate are 1600 erg/cm$^2$, and less than 730 erg/cm$^2$. The substrate was preheated to a temperature of about 400° C., then removed from the heat source and allowed to cool during sputtering. Titanium was sputtered in an argon atmosphere at a pressure of 6 millitorr, and at a deposition rate of about 7 nm/second. Sputtering continued to a texture layer thickness of about 200 nm. The resulting bumps had diameters of about 2 micrometers and heights of about 15 nm. Bumps were formed at a density of about $5 \times 10^6$/cm$^2$.

EXAMPLE 2

The conditions and materials were the same as in Example 1, except that the sputtering pressure was increased to 10 millitorr. The resulting bumps had diameters of about 1 micron, as compared to the 2 micron diameters of Example 1.

EXAMPLE 3

Conditions and materials were the same as in Example 1, except that the substrate was preheated to a temperature of about 500° C. The resulting bumps had a density of about $10 \times 10^6$/square centimeter, about double the density of the bumps formed in Example 1.

EXAMPLE 4

Conditions and materials were the same as in Example 1, except that the Ti film was deposited to a thickness of about 300 nm. The thicker texture film resulted in bumps having heights of about 25 nm, as compared to the 15 nm height in Example 1.

EXAMPLE 5

Sputtering conditions and materials were the same as in Example 1, except that hydrogen gas (H$_2$ at less than 15%) was introduced during sputtering of the texture layer. Both bump height and bump size were reduced, due to the change in stress in the texture layer. Increasing the percentage of hydrogen, to values above 15% (atomic percent), further reduces bump size.

EXAMPLE 6

A Ti texturing material was sputter deposited onto a super smooth aluminum Ni—P substrate. The thermal expansion coefficient of the AlNiP substrate is $22 \times 10^{-6}$/degree C. The surface energy of the substrate is less than 500 erg/cm$^2$. The substrate was preheated to a temperature of about 300° C., then removed from the heat source to allow cooling during deposition. The titanium was deposited at a pressure of about 6 millitorr and at a deposition rate of about 7 nm/second to a thickness of about 200 nm. The resulting bumps had diameters of about 3 microns and heights of about 20 nm. Bump density was about $7 \times 10^6$/square centimeter.

EXAMPLE 7

Sputtering conditions and materials were the same as in Example 6, except that the pressure was increased to about 12 millitorr. Bump diameters were reduced from about 3 microns to about 1 micron.

EXAMPLE 8

Conditions and materials were the same as in Example 6, except that the substrate was preheated to a temperature of about 400° C. The bump density increased to about $12 \times 10^6$/square centimeter.

EXAMPLE 9

Conditions and materials were the same as in Example 6, except that the Ti was sputtered to a thickness of about 300 nm. The bump height increased to about 35 nm.

EXAMPLE 10

Conditions and materials were the same as in Example 1, except that a tungsten texture layer was sputter deposited onto a glass-ceramic substrate. A much higher temperature was required (i.e. preheating to about 600° C.) The result was much larger bumps, having diameters of about 6 microns. Bump density was reduced to about $0.5 \times 10^4$/square centimeter. The bump heights remained approximately the same.

Magnetic disks fabricated as discussed above have performed well under CSS testing. FIGS. 10–15 depict the results of testing two disks, one with a glass substrate tested for 5,000 start/stop cycles, and the other having an aluminum substrate and tested for 30,000 start/stop cycles. Values were measured at 20-cycle intervals in both cases.

Figure 10:
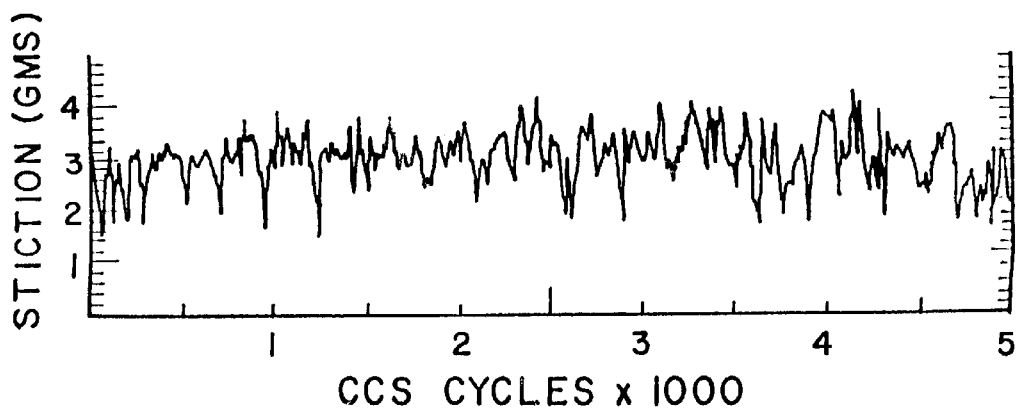
FIGS. 10–15 are charts depicting CSS performance of two examples of the recording medium.
Figure 11:
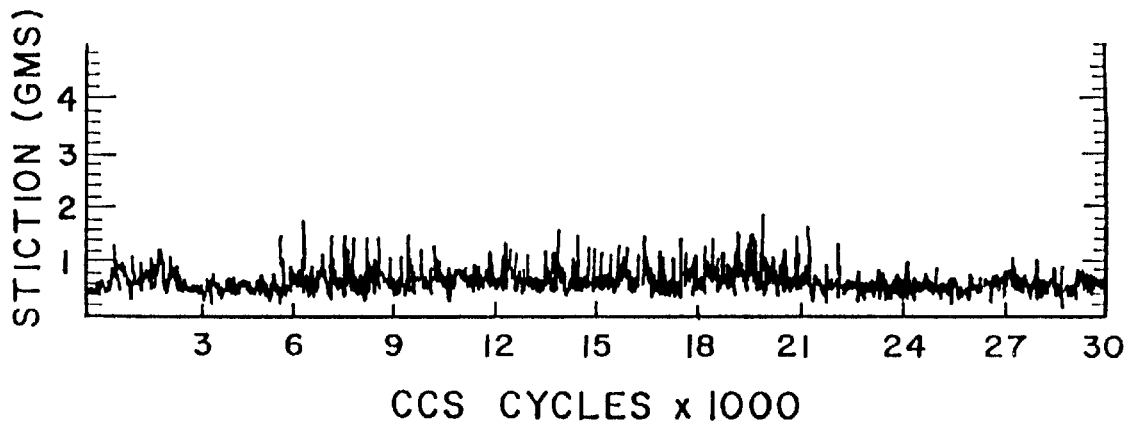

FIGS. 10 and 11 respectively illustrate stiction behavior of the disk with aluminum substrate and the disk with the glass-ceramic substrate. Both disks have a glide avalanche of under 1.0 microinch. More specifically, the value is 0.9 microinch for the AlNiP disk, and 0.74 microinch for the glass-ceramic disk. The first disk (glass-ceramic substrate) exhibited a final average stiction of 2.35 gms with a maximum stiction of 4.19 gms. The second disk (aluminum substrate) exhibited final average and maximum stiction values of 0.579 gms and 1.91 gms, respectively. Stiction remained substantially the same in both cases.

Figure 12:
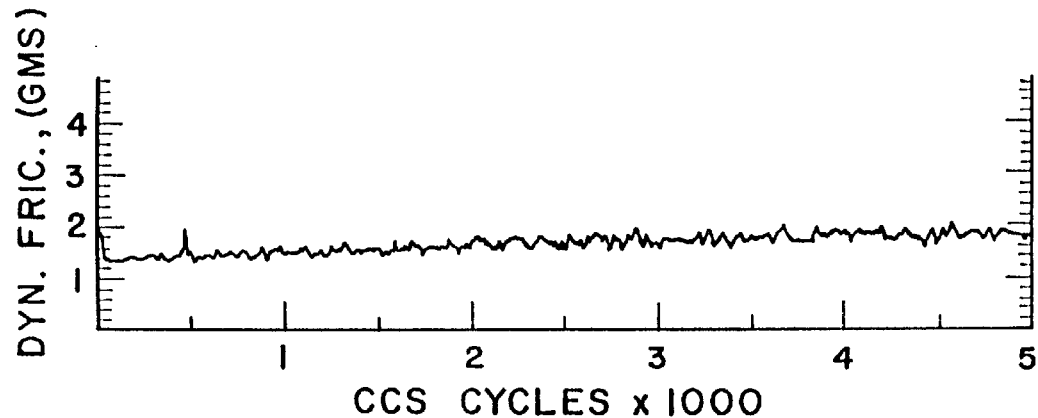
Figure 13:
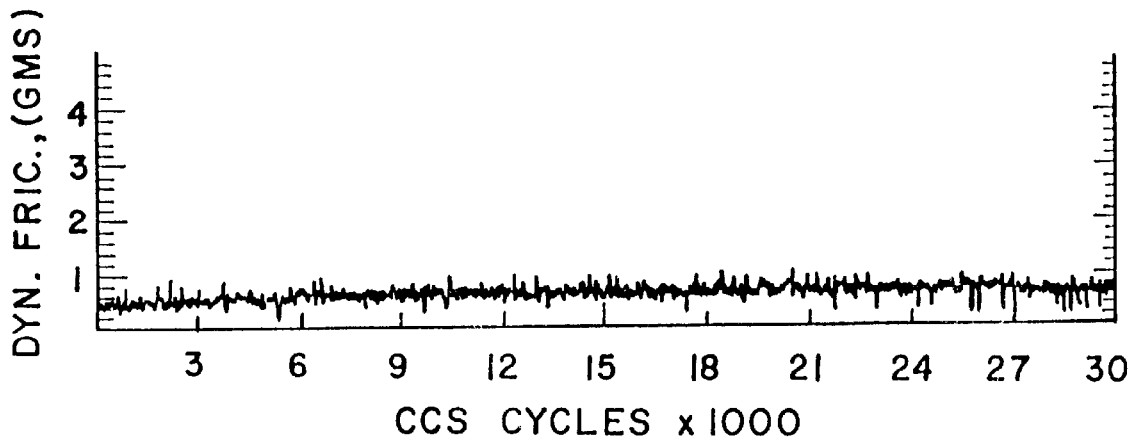

FIGS. 12 and 13 show the dynamic friction performance of the first and second disks, respectively. The first disk exhibited an initial dynamic friction of 1.56 gms, a final dynamic friction of 1.84 gms and a maximum dynamic friction of 2.25 gms. The second disk had an initial dynamic friction of 0.4 gms, a final dynamic friction of 0.735 gms and a maximum dynamic friction of 0.88 gms. The disks had respective friction coefficients of 0.749 gms and 0.187 gms.

Figure 14:
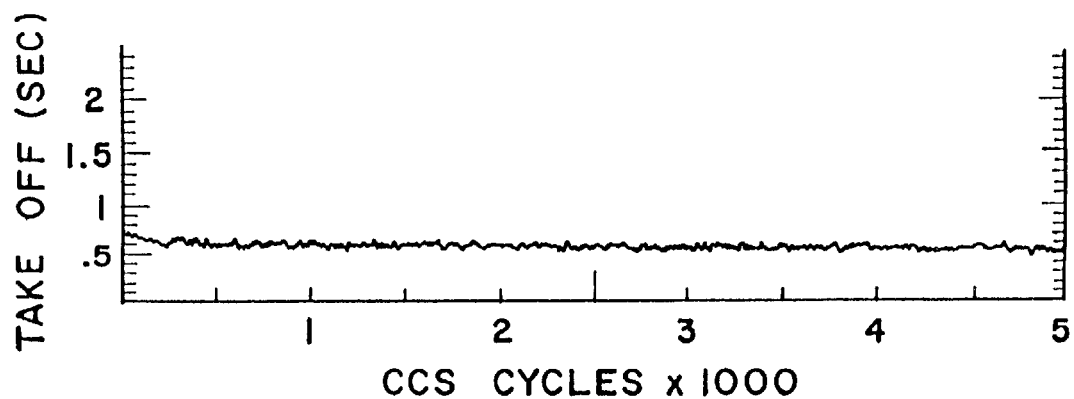
Figure 15:
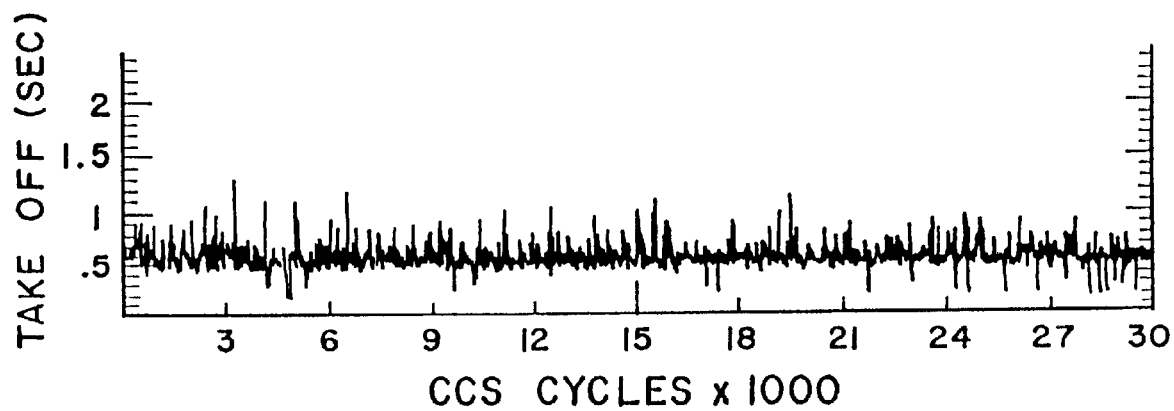
Figure 16:
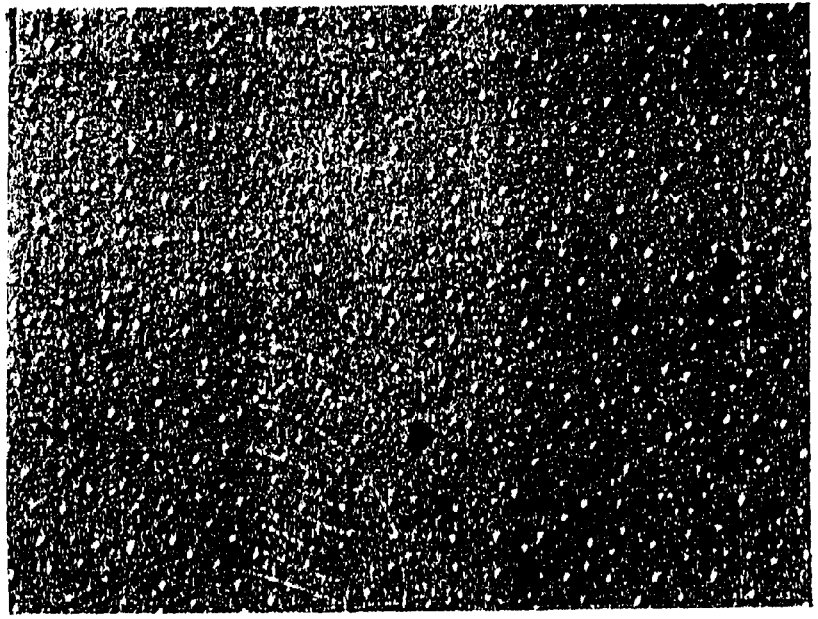
FIGS. 16–19 are optical micrographs of texture layers sputtered on four different non-magnetic substrates.
Figure 17:
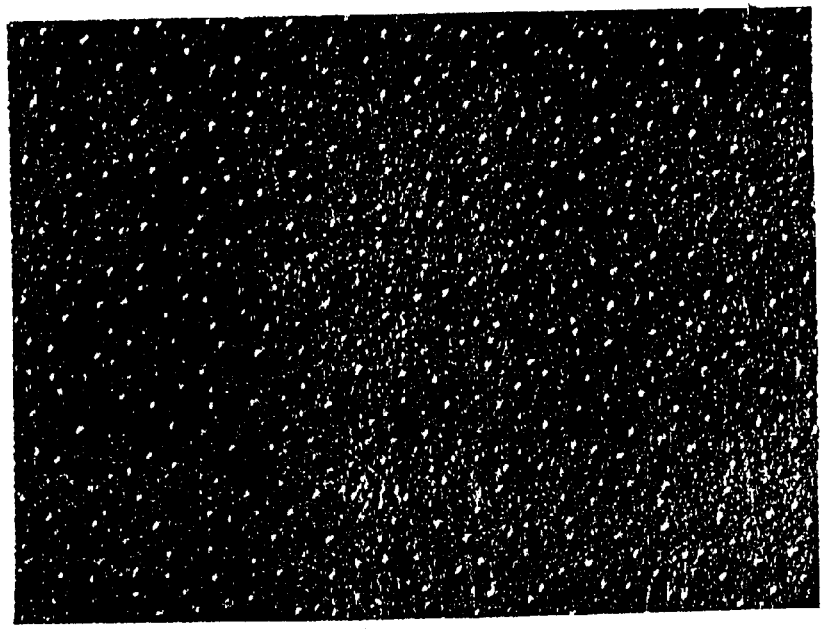
Figure 18:
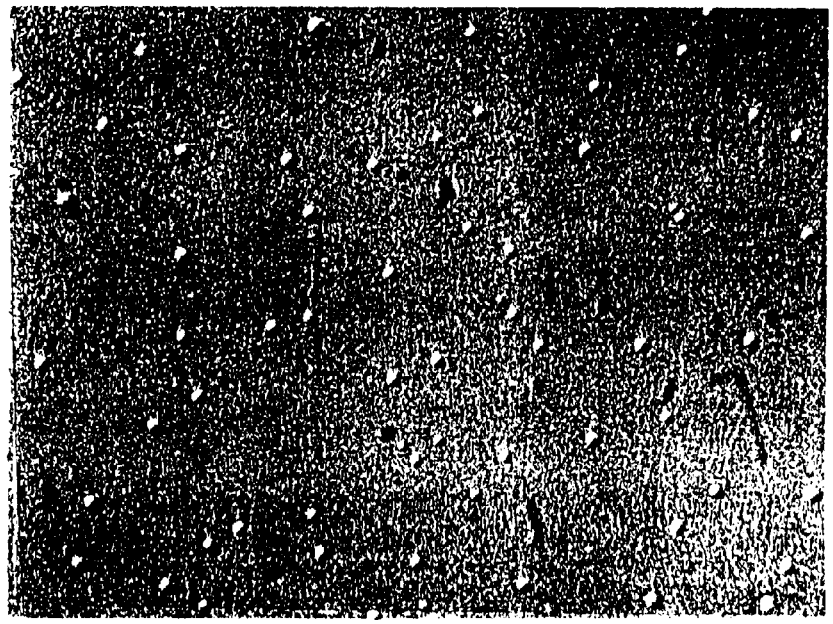

Both disks remained substantially constant as to take-off time, exhibiting final take-off times of 0.572 seconds and 0.558 seconds, respectively as seen in FIGS. 14 and 15.

The tested characteristics (stiction, wear and take-off time) revealed performance superior to that of conventional textured disks, and superior to other known texture approaches currently under development. The stiction values are about one-third to one-half of those for conventional mechanical texturing and the wear indices are about one-half those of conventionally textured disks. The take-off time is at most equal to, and frequently less than, that of other types of textured disks.

In general, CSS testing was performed at extremely low transducer flying heights, in the range of about 0.7 to about 1.0 microinch transducer flying heights as mentioned above. Despite flying heights of less than a microinch, the stiction and wear index values were very low and the take-off time was short, indicating a texture superior to conventional mechanical texture and other textures known to be currently under development. After CSS testing, the stiction and wear index values remained, within measurement error, unchanged. Thus the texturing is stable and has a high tolerance for CSS testing conditions and for normal operating conditions. Thus, testing has demonstrated excellent media performance under challenging conditions when texture layers are formed according to the present invention.

The disks further have exhibited excellent performance when tested for corrosion. In particular, when subjected to testing at 100% relative humidity at 80° C., the disks have shown good resistance to haze corrosion.

Figure 19:

Texture layers, formed as explained, can be applied to virtually any type of non-magnetic substrate. FIGS. 16–19 are optical micrographs (magnification 400 X) showing texturing layers applied to different substrates including a polished aluminum nickel phosphorous substrate (FIG. 16); a Canasite glass-ceramic substrate (FIG. 17); an Ohara smooth glass ceramic substrate (FIG. 18); and a Pilkington smooth glass substrate (FIG. 19). The micrographs reveal the smooth, rounded nature of the bumps, and the degree of separation between neighboring bumps.

Figure 20:
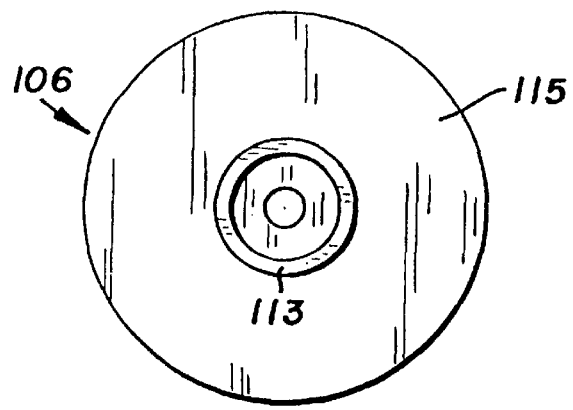
FIGS. 20–22 illustrate an alternative recording medium with a texture layer covering only part of the substrate surface, supported on a platform that more rapidly cools the substrate.
Figure 21:
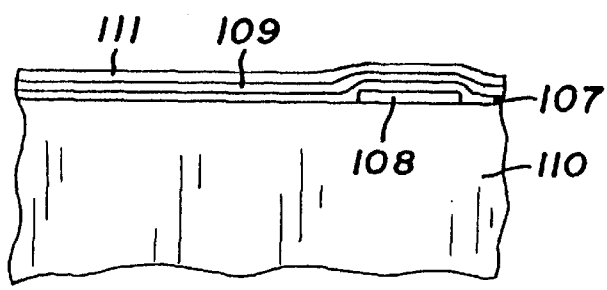

FIGS. 20 and 21 illustrate an alternative recording medium 106 fabricated with a fixture so that a texture layer 108 covers only an annular portion of the upper surface of a substrate 110. Further thin film layers include an underlayer 107, a magnetic recording layer 109 and a protective cover layer 111, substantially similar to their counterparts discussed above in connection with disk 16. As a result, the upper surface of medium 106 includes three annular regions: a radially inward region for clamping to a spindle as before, a dedicated transducing head contact zone 113, and an annular data zone 115 providing the area for recording and reading the magnetic data.

When medium 106 is in use at rest, a transducing head contacts the disk within contact zone 113. During data operations, the air cushion caused by medium rotation supports the transducing head at a desired glide height above data zone 115. When magnetic medium 106 is decelerated following an operation, the transducing head is moved radially inward to a position over contact zone 113, so that when coming to rest the head engages the contact zone. Before the next recording or retrieval operation, medium 106 is accelerated from stop, initially with the head and contact zone engaged. Once rotation is sufficient to support the transducing head with an air cushion, the head is moved to the intended position within the data zone.

The data and contact zones have different textures according to their respective functions. Data zone 115 preferably is polished or otherwise finished to a highly smooth, specular finish to permit the desired low transducing head glide height. By contrast, contact zone 113 has a surface roughness greater than the data zone, i.e. in the range of from 7 to 18 nm. Roughness in this context means the height of the highest peaks above a nominal horizontal plane of the surface 18.

Figure 22:
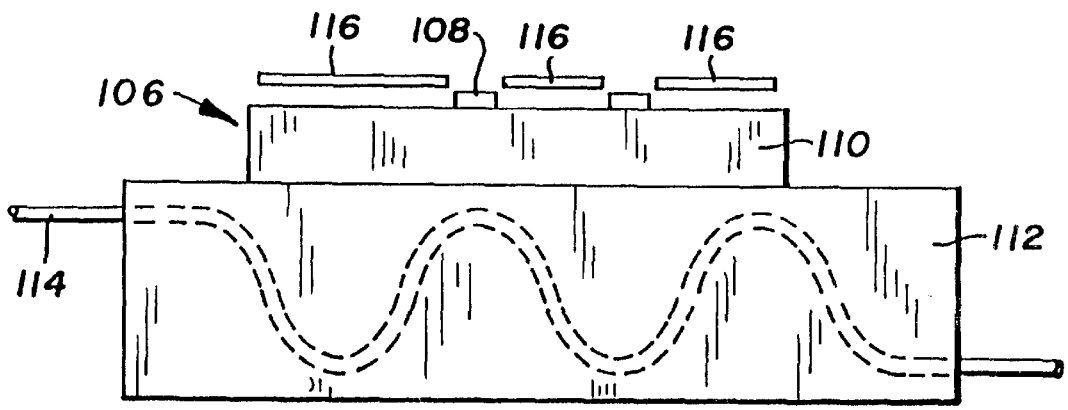

Fabrication of recording medium 106 proceeds as described above in connection with disk 16, with one exception. A fixture 116, preferably a metal shield, is disposed within the plasma chamber immediately above substrate 110. As illustrated in FIG. 22, fixture 116 masks the substrate to restrict deposition of the texture layer to the intended annular region that becomes contact zone 113 in the finished medium.

Because substrate 110 and texture layer 108 are extremely thin axially (vertical in FIG. 22) compared to their radial dimensions, they lose heat primarily in the axial direction. Accordingly, whether the texture layer is applied to the entire surface as shown in FIGS. 1 and 2, or just to a limited annular area intended as the contact zone, does not appreciably alter cooling time. However, cooling time can be reduced if desired by more rapidly extracting heat from a platform 112 that supports the substrate. For this purpose, a cooling coil 114 within the platform provides a path for transmitting a heat absorbing fluid (e.g. helium at low pressure) through the platform. This augments the tendency of platform 112 to act as a heat sink. The result is a more rapid cooling of substrate 110 and texture layer 42, which facilitates the use of substrate and texturing materials having less pronounced differences in their thermal expansion coefficients, and results in the formation of smaller bumps. Although shown in connection with limited texturing to provide a contact zone, platform 112 can just as well be employed when the texture layer covers the entire substrate surface.

Figure 23:
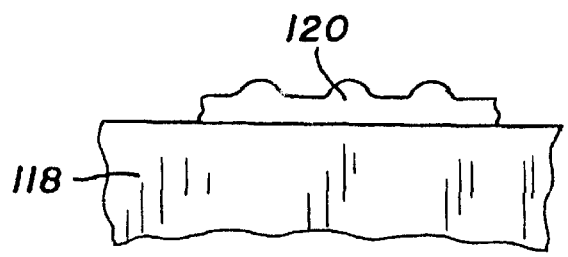
FIG. 23 illustrates a further alternative example of a recording medium, in which a texturing layer is applied to a substrate having a lower linear coefficient of thermal expansion.

FIG. 23 illustrates an alternative substrate 118 and a texture layer 120 applied to the substrate. In this case, the substrate, formed of glass, has a linear coefficient of thermal expansion less than the thermal expansion coefficient of the texture layer. Thus, cooling substrate 118 and texture 120 would cause the texture layer to contract at the more rapid rate, whereupon tension rather than compression would be induced. Bumps would not form under these circumstances. Accordingly, texture layer 120 is applied by a low temperature deposition process, with no preheating of the substrate. The desired texture is obtained by heating the texture layer and substrate, to induce compression in the texture layer since it tends to expand more rapidly than the substrate in response to heating. Subsequent thin film layers are applied by vacuum deposition as explained above.

Thus in accordance with the present invention, a uniform, controlled texturing layer can be formed on a non-magnetic substrate in a relatively short time, regardless of whether the texture is limited to an intended contact zone or applied to the entire upper surface of the substrate. A high degree of repeatability and control is afforded by proper selection of parameters such as substrate temperature when deposition begins, deposition pressure, thickness of the texture layer and the substrate and texture layer materials.

What is claimed is:

1. A magnetic data storage medium comprising:
   a non-magnetic substrate having a substantially smooth substrate surface and a first linear coefficient of thermal expansion;
   a thin film texture layer applied over the substrate surface and integral with the substrate, said thin film texture layer including multiple local discontinuities formed by plastic deformation of the thin film to relieve mechanical stresses induced in the thin film by temperature cycling of the substrate and thin film, said discontinuities cooperating to define a surface roughness of the thin film; and
   a magnetic thin film recording layer applied over the thin film texture layer at a substantially uniform thickness to substantially replicate the thin film texture layer topography.

2. The medium of claim 1 wherein:
   said discontinuities consist substantially of smoothly rounded dome-like bumps.

3. The medium of claim 2 wherein:
   said bumps are distributed substantially uniformly, at a density in the range of about 300,000 to 1,200,000 bumps per square centimeter.

4. The medium of claim 2 wherein:
   said bumps have maximum peak heights in the range of about 7–18 nm.

5. The medium of claim 1 further including:
   a thin film underlayer deposited onto the thin film texture layer and disposed between the texture layer and the thin film recording layer, and having a substantially uniform thickness to replicate the topography of the texture layer.

6. The medium of claim 5 further including:
   a protective cover layer deposited onto the thin film recording layer.

7. The medium of claim 6 wherein:
   said thin film texturing layer consists essentially of a binary alloy formed of a pair of said elements.

8. The medium of claim 1 wherein:
   said thin film texturing is comprised of at least one of the following elements: chromium, titanium, aluminum, tungsten, gold, silver and tantalum.

9. The medium of claim 1 wherein:
   said substrate consists essentially of one of the following materials: glass, a glass-ceramic, quartz, and aluminum plated with a nickel-phosphorous alloy.

10. The magnetic medium of claim 1 wherein:
    said texture layer covers only an annular segment of said substrate surface.

11. The recording medium of claim 1 wherein:
    said texture layer covers substantially all of said substrate surface.

12. The recording medium of claim 1 wherein:
    said substrate surface is substantially planar.

13. A process for forming a texture on a non-magnetic substrate, including:
    providing a non-magnetic substrate having a substantially planar and smooth substrate surface and having a first linear coefficient of thermal expansion;
    selecting a texturing material having a second linear coefficient of thermal expansion different than the first linear coefficient of thermal expansion;
    initiating a deposition of the texturing material over the substrate surface when the substrate is at a selected initial temperature, and continuing the deposition to form a texturing material thin film integral with the substrate; and causing a change in the temperature of the substrate away from the selected initial temperature to induce mechanical stresses in said thin film due to the respective and different changes in dimensions of the substrate and thin film responsive to the temperature change, said induced mechanical stresses exceeding an elastic limit of the texturing material to alter a surface topography of the thin film due to plastic deformation of the texturing material.

14. The process of claim 13 wherein:

said causing the change in substrate temperature, and said continuing of the deposition, occur simultaneously.

15. The process of claim 13 further including:

using a heat source to heat the substrate, prior to the initiation of deposition, to a temperature at least as high as said initial temperature.

16. The process of claim 15 wherein:

said initial temperature is in the range of about 200 to 600 degrees C.

17. The process of claim 15 wherein:

said causing of the change in substrate temperature comprises allowing the substrate to cool in an ambient environment.

18. The process of claim 15 further including:

after the substrate temperature has moved toward an ambient level, and after completion of said deposition, heating the substrate and thin film to a reheat temperature of at least 150 degrees C., then allowing the substrate and thin film to cool.

19. The process of claim 15 wherein:

said causing the change in the substrate temperature includes employing a heat sink to cool the substrate.

20. The process of claim 15 wherein:

said first linear thermal expansion coefficient is greater than said second linear thermal expansion coefficient whereby said mechanical stresses in said thin film induced by cooling the substrate and the thin film are compressive stresses.

21. The process of claim 13 wherein:

said deposition comprises sputtering the texturing material over the substrate surface in a partial vacuum.

22. The process of claim 21 wherein:

said sputtering occurs within a vacuum chamber at a deposition pressure in the range of about 3–50 militorr.

23. The process of claim 21 wherein:

said deposition comprises sputtering the thin film to a thickness of less than about 5,000 angstroms.

24. The process of claim 23 wherein:

the thickness of the thin film is in the range of about 500–3000 angstroms.

25. The process of claim 21 further including:

after said change in the temperature, sputtering at least one further material onto the texture determining thin film to form a thin film layer having a uniform thickness to substantially replicate the surface topography of the texturing material thin film.

26. The process of claim 13 wherein:

said texturing material has a surface energy greater than a surface energy of the non-magnetic substrate.

27. A process for fabricating a magnetic data storage medium, including:

providing a non-magnetic substrate having a substantially smooth substrate surface, and having a first linear coefficient of thermal expansion;

selecting a texturing material having a second linear thermal expansion coefficient different than the first linear thermal expansion coefficient;

heating the substrate above an ambient temperature at least to a selected initial temperature;

initiating a vacuum deposition of the texturing material over said substrate surface when the substrate is at least approximately at the initial temperature;

continuing said deposition to form a thin film texture layer integral with the substrate;

cooling the substrate and the applied texturing material below said initial temperature to induce mechanical stresses in the thin film texturing layer due to different respective rates at which the substrate and the thin film texturing layer contract responsive to said cooling, with said cooling being sufficient to induce mechanical stresses in the thin film texturing layer that exceed an elastic limit of the texturing material to cause elastic deformation of the thin film texturing layer to form multiple bumps distributed throughout the thin film texture layer; and depositing a magnetic thin film recording layer over the magnetic thin film texture layer, after said cooling.

28. The process of claim 27 wherein:

said cooling and said deposition occur simultaneously.

29. The process of claim 27 wherein:

said cooling consists substantially of maintaining the substrate and texturing material in an ambient environment.

30. The process of claim 27 wherein:

said cooling includes providing a heat sink adjacent the substrate to conductively cool the substrate.

31. The process of claim 27 wherein:

said deposition includes sputtering the texture material onto the substrate surface, at a deposition pressure in the range of about 3–50 militorr.

32. The process of claim 27 wherein:

said heating comprises heating the substrate to an initial temperature of at least 200 degrees C.

33. The process of claim 32 wherein:

said initial temperature is in the range of about 200–400 degrees C.

34. The process of claim 27 wherein:

said texturing material has a surface energy greater than a surface energy of the non-magnetic substrate.

* * * * *